United States Patent
Yao et al.

(10) Patent No.: US 12,349,343 B2
(45) Date of Patent: Jul. 1, 2025

(54) METHOD FOR MAKING ACTIVE AREA AIR GAP

(71) Applicant: Shanghai Huali Microelectronics Corporation, Shanghai (CN)

(72) Inventors: Shaokang Yao, Shanghai (CN); Qiwei Wang, Shanghai (CN); Haoyu Chen, Shanghai (CN)

(73) Assignee: Shanghai Huali Microelectronics Corporation (CN)

( * ) Notice: Subject to any disclaimer, the term of this patent is extended or adjusted under 35 U.S.C. 154(b) by 443 days.

(21) Appl. No.: 18/152,868

(22) Filed: Jan. 11, 2023

(65) Prior Publication Data
US 2023/0164992 A1    May 25, 2023

(30) Foreign Application Priority Data

May 30, 2022    (CN) .......................... 202210597596.2

(51) Int. Cl.
*H10B 41/30*    (2023.01)
*H10B 41/10*    (2023.01)

(52) U.S. Cl.
CPC ............ *H10B 41/30* (2023.02); *H10B 41/10* (2023.02)

(58) Field of Classification Search
CPC .............................. H10B 41/30; H10B 41/10
See application file for complete search history.

(56) References Cited

U.S. PATENT DOCUMENTS

2022/0367499 A1*  11/2022  Matsuno ................ H10B 43/27
2023/0298933 A1*   9/2023  Chou .................. H01L 23/5329

* cited by examiner

*Primary Examiner* — Richard A Booth
(74) *Attorney, Agent, or Firm* — Quarles & Brady LLP

(57) ABSTRACT

The present application discloses a method for making an active area air gap, comprising: step 1, performing word line etching to form a plurality of word line structures on a semiconductor substrate, wherein each word line structure spans each field oxide and each active area; step 2, forming a protective spacer on a side surface of the word line structure in a self-aligned manner; step 3, etching the field oxide by means of isotropic etching, so as to lower the top surfaces of the field oxides within and outside a coverage area of the word line structure and thus form an active area air gap between the active areas, wherein the word line structure spans the active area air gap; and step 4, removing the protective spacer.

16 Claims, 8 Drawing Sheets

Step 1. Word line etching is performed to form a plurality of word line structures on a semiconductor substrate, wherein each word line structure spans each field oxide and each active area Step 2. A protective spacer is formed on a side surface of the word line structure in a self-aligned manner Step 3. The field oxide is etched by means of isotropic etching, so as to lower the top surfaces of the field oxides within and outside a coverage area of the word line structure and thus form an active area air gap between the active areas, wherein the word line structure spans the active area air gap Step 4. The protective spacer is removed Step 1. Word line etching is performed to form a plurality of word line structures on a semiconductor substrate, wherein each word line structure spans each field oxide and each active area Step 2. A protective spacer is formed on a side surface of the word line structure in a self-aligned manner Step 3. The field oxide is etched by means of isotropic etching, so as to lower the top surfaces of the field oxides within and outside a coverage area of the word line structure and thus form an active area air gap between the active areas, wherein the word line structure spans the active area air gap Step 4. The protective spacer is removed

FIG. 2

METHOD FOR MAKING ACTIVE AREA AIR GAP

CROSS-REFERENCES TO RELATED APPLICATIONS

This application claims the priority to Chinese patent application No. CN 202210597596.2, filed on May 30, 2022, and entitled "METHOD FOR MAKING ACTIVE AREA AIR GAP", the disclosure of which is incorporated herein by reference in entirety.

TECHNICAL FIELD

The present application relates to a semiconductor integrated circuit, in particular to a method for making an active area (AA) air gap.

BACKGROUND

As a non-volatile memory, the NAND flash is applicable to data storage and is widely applied in fields such as fields, automobiles, and industrial electronics due to its advantages such as large capacity, fast erasing and writing speed, and low cost. With the development of technologies, the size of an active area is continuously scaled down to satisfy the increasing demand for a storage capacity. As the distance between two adjacent active areas continuously decreases, the crosstalk between the active areas continuously increases, affecting a programming/erasing window of the memory, and leading to poor reliability.

FIG. 1A is a top view of a storage area of an existing NAND flash. FIG. 1B is a sectional view along the dashed line AA in FIG. 1A. A plurality of word line structures are formed on a semiconductor substrate 101, a plurality of field oxides 102 are formed on the semiconductor substrate 101, and a plurality of active areas are isolated from each other by the field oxides 102. Each of the word line structures spans each of the field oxides 102 and each of the active areas.

In FIG. 1A, the semiconductor substrate 101 between the field oxides 102 forms the active area. The section at the dashed line AA is a section along the word line structure.

An area of the word line structure that covers the top of the active area forms a gate structure of a device cell. The gate structures of all the device cells on the same word line structure are connected together to form a row structure.

All the device cells on the same active area form a column structure, and the row structure and the column structure form an array structure.

In a formation area of the array structure, the length directions of all the active areas are parallel to each other.

The length direction of each of the word line structures is perpendicular to the length direction of the active area.

In the storage area of the NAND flash, the device cell is a memory cell, and the array structure forms a storage array of the NAND flash.

Referring to FIG. 1B, the gate structure of the memory cell includes a tunneling dielectric layer 105, a floating gate 103, an inter-gate dielectric layer 106, and a control gate 104 that are stacked in sequence. In FIG. 1A, a top view structure of the word line structure is the same as a top view structure of the control gate 104.

Referring to FIG. 1B, a structure of the word line structure that covers the top of the field oxide 102 includes the inter-gate dielectric layer 106 and the control gate 104 stacked in sequence.

The tunneling dielectric layer 105 and the floating gate 103 are located in an overlap area of the control gate 104 and the active area. In FIG. 1A, a formation area of the floating gate 103 is represented by a dashed line box.

Generally, the floating gate 103 and the control gate 104 are both formed of polysilicon, and the inter-gate dielectric layer 106 is also referred to as an interpoly dielectric layer (IPD).

It can be seen from FIG. 1B that a channel area is formed on the surface of the active area covered by the gate structure of the memory cell. As the scaling-down of the device size, the distance between two adjacent active areas continuously decreases, and thus the crosstalk between two adjacent memory cells continuously increases, affecting a programming/erasing window of the memory, and leading to poor reliability.

A method for reducing the crosstalk between two adjacent memory cells is providing an air gap between the active areas. Compared with the field oxide, air has a smaller dielectric constant, so the provision of the air gap can reduce the coupling capacitance between the active areas, thereby reducing the crosstalk between the memory cells of the active areas. However, it can be seen from FIG. 1A that as the device size is scaled down, the device density becomes extremely large, and it becomes very difficult to form an air gap between the active areas.

BRIEF SUMMARY

The technical problem to be solved by the present application is to provide a method for making an active area air gap, which can remove a field oxide under a coverage area of a word line structure to form an active area air gap without a damage to the word line structure, thereby effectively reducing coupling capacitance between active areas and reducing crosstalk.

According to some embodiments in this application, the method for making an active area air gap provided by the present application includes the following steps:

step 1, performing word line etching to form a plurality of word line structures on a semiconductor substrate, wherein a plurality of field oxides are formed on the semiconductor substrate, a plurality of active areas are isolated from each other by the field oxides, and each of the word line structures spans each of the field oxides and each of the active areas;

step 2, forming a protective spacer on a side surface of the word line structure in a self-aligned manner, wherein the materials of the protective spacer and the field oxide have different etching rates;

step 3, etching the field oxide by means of isotropic etching, so as to lower the top surfaces of the field oxides within and outside a coverage area of the word line structure and thus form an active area air gap between the active areas, wherein the word line structure spans the active area air gap, during the isotropic etching, an etching rate of the protective spacer is less than an etching rate of the field oxide, and after the isotropic etching is completed, the protective spacer is retained on the side surface of the word line structure to protect the word line structure; and step 4, removing the protective spacer.

In some cases, before the formation of the protective spacer in step 2, the method further includes performing first etching on the field oxide outside the coverage area of the word line structure, wherein the first etching is anisotropic etching, the first etching makes the top surface of the field oxide outside the coverage area of the word line structure lower than the top surface of the active area, the top surface of the field oxide within the coverage area of the word line structure is higher than the top surface of the field oxide outside the coverage area of the word line structure, and therefore the side surface of the field oxide is formed at the bottom of the word line structure.

In step 2, within an area of the field oxide, the protective spacer extends to the side surface of the field oxide at the bottom of the word line structure.

In some cases, the first etching is directly implemented by means of the word line etching.

In some cases, an area of the word line structure that covers the top of the active area forms a gate structure of a device cell, and the gate structures of all the device cells on the same word line structure are connected together to form a row structure.

In some cases, all the device cells on the same active area form a column structure, and the row structure and the column structure form an array structure.

In some cases, in a formation area of the array structure, the length directions of all the active areas are parallel to each other.

In some cases, the length direction of each of the word line structures is perpendicular to the length direction of the active area.

In some cases, the device cell includes a memory cell of a NAND flash, and the array structure forms a storage array of the NAND flash.

In some cases, a gate structure of the memory cell includes a tunneling dielectric layer, a floating gate, an inter-gate dielectric layer, and a control gate that are stacked in sequence.

In some cases, a structure of the word line structure that covers the top of the field oxide includes the inter-gate dielectric layer and the control gate stacked in sequence.

The tunneling dielectric layer and the floating gate are located in an overlap area of the control gate and the active area.

In some cases, an etching amount of the first etching on the field oxide is 200-500 Å.

In some cases, the material of the protective spacer is a polymer.

In some cases, after gate etching is completed, the polymer is directly deposited in an etching machine for the gate etching.

After deposition of the polymer is completed, self-aligned etching is directly performed in the etching machine for the gate etching to form the protective spacer.

In some cases, a deposition thickness of the polymer is 10-30 Å.

In some cases, in step 3, an etching amount of the isotropic etching on the field oxide is ½ of the width of the word line structure.

In some cases, in step 4, the protective spacer is removed by means of wet etching.

In the present application, the steps of self-aligned formation of the protective spacer on the side surface of the word line structure and isotropic etching on the field oxide are added after word line etching. In this way, not only the field oxide outside the coverage area of the word line structure can be removed, the field oxide under the coverage area of the word line structure can also be removed to form the active area air gap, thereby effectively reducing coupling capacitance between the active areas and reducing crosstalk.

When the present application is applied to a NANS flash, programming and erasing windows and reliability can be improved.

An etching area of the field oxide in the embodiments of the present application is a protective spacer formed in a self-aligned manner, having the characteristics of simple and easily achievable processes.

The protective spacer in the present application can also protect the word line structure during the isotropic etching on the field oxide, so that no damage occurs to the composition structure of the word line structure.

BRIEF DESCRIPTION OF THE DRAWINGS

The present application is described in detail below with reference to the drawings and specific implementations:

FIG. 2 is a flowchart of a method for making an active area air gap according to an embodiment of the present application.

FIGS. 4A-8A are sectional views along the dashed line BB in FIG. 3 in steps of the method for making an active area air gap according to an embodiment of the present application.

FIGS. 4B-8B are sectional views along the dashed line CC in FIG. 3 in steps of the method for making an active area air gap according to an embodiment of the present application.

DETAILED DESCRIPTION OF THE DISCLOSURE

Figure 1A:
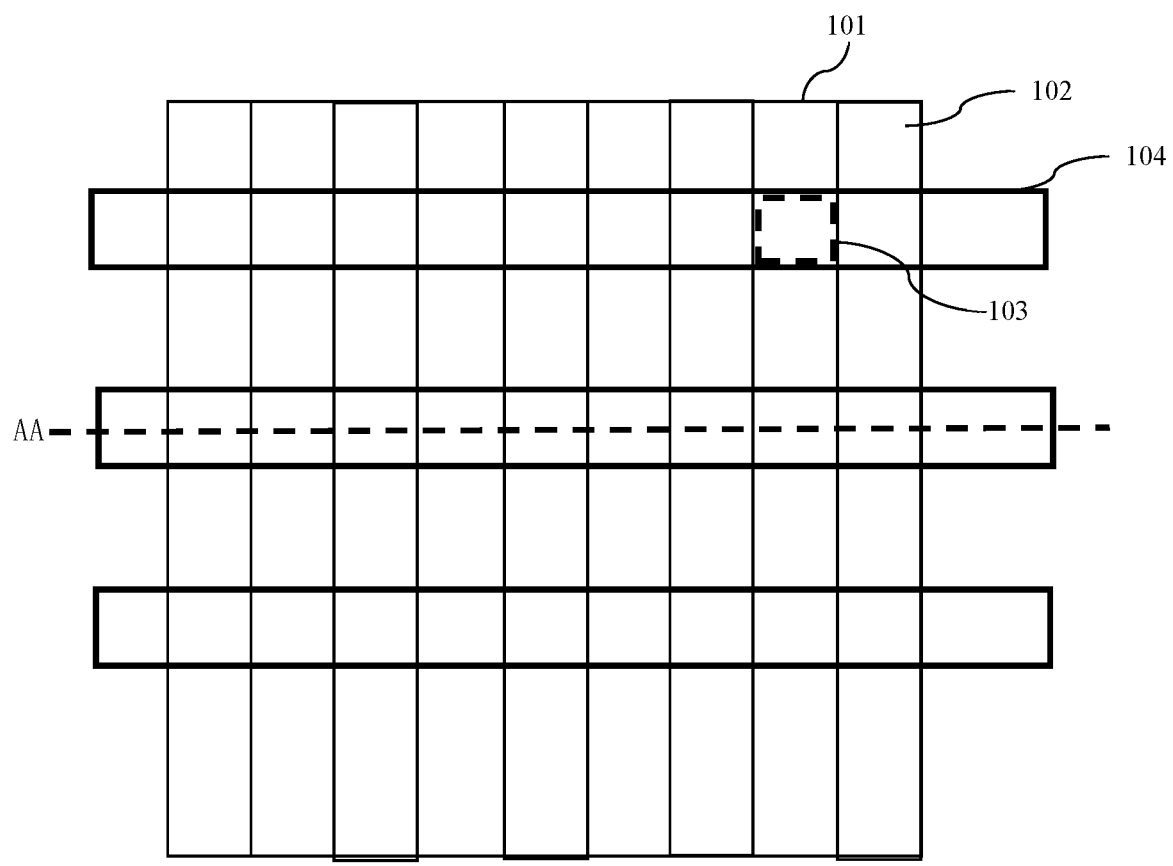
FIG. 1A is a top view of a storage area of an existing NAND flash.
Figure 1B:
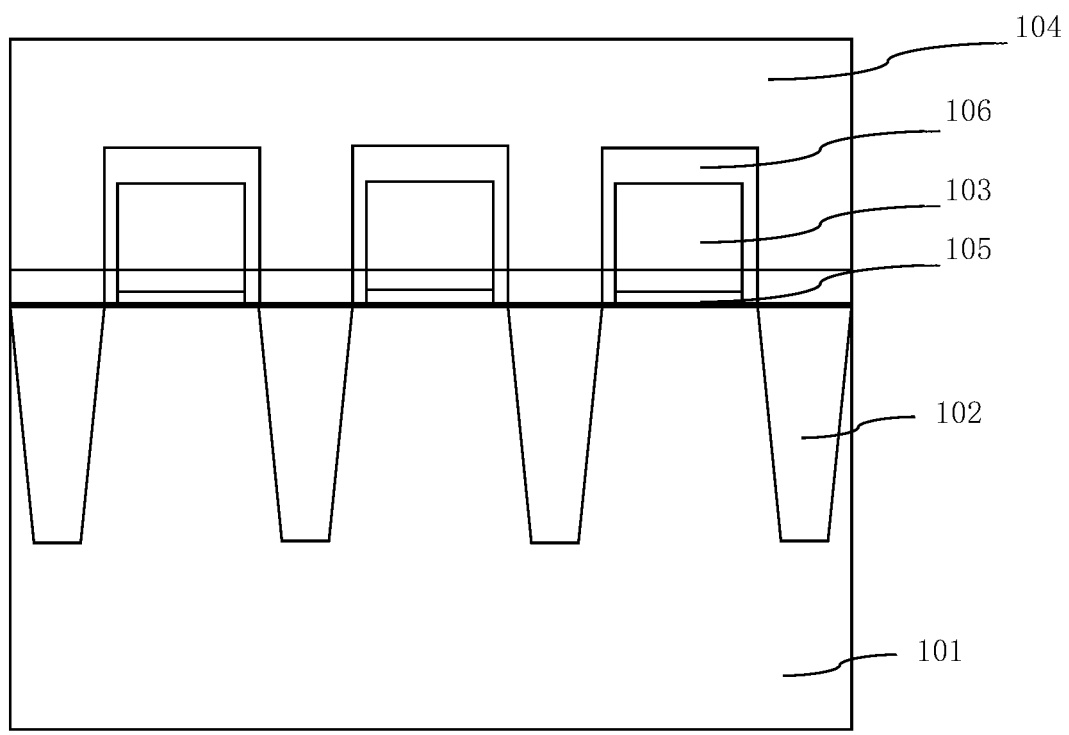
FIG. 1B is a sectional view along the dashed line AA in FIG. 1A.
Figure 3:
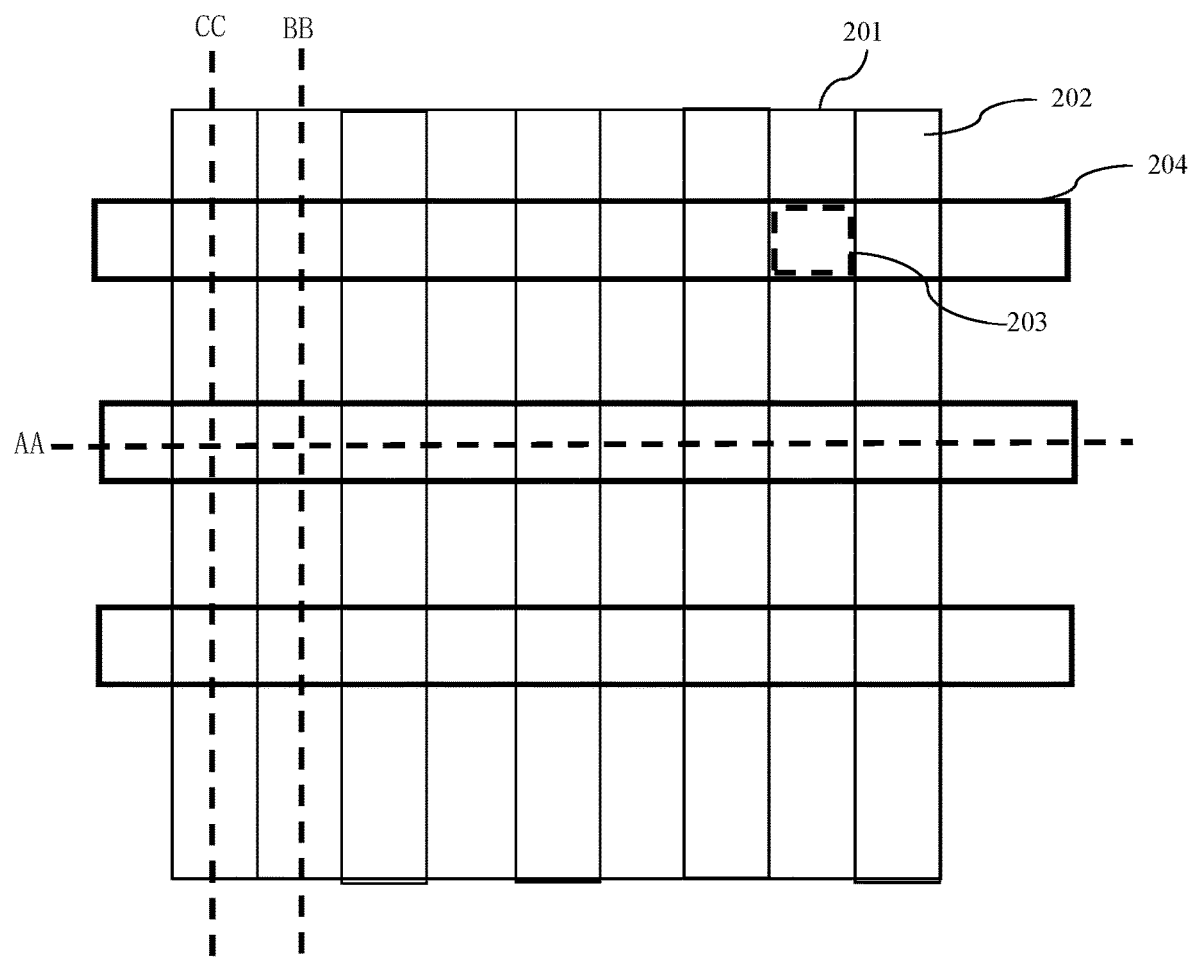
FIG. 3 is a top view of a storage area of a NAND flash formed by the method for making an active area air gap according to an embodiment of the present application.
Figure 8A:
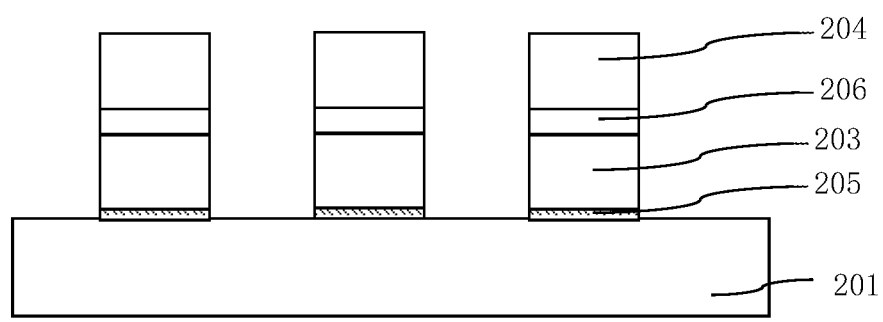
Figure 8B:
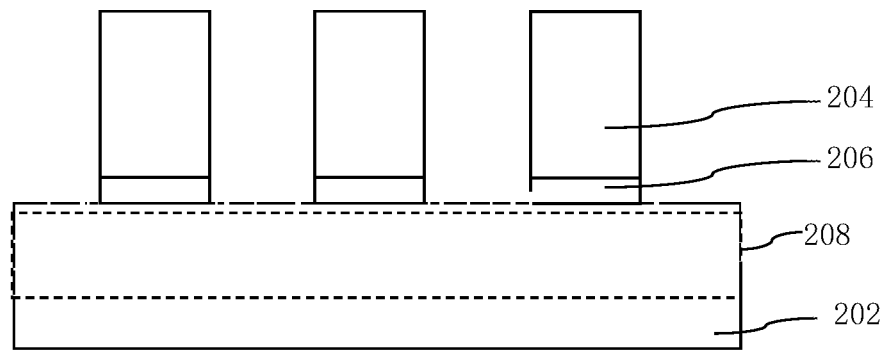
Figure 9:
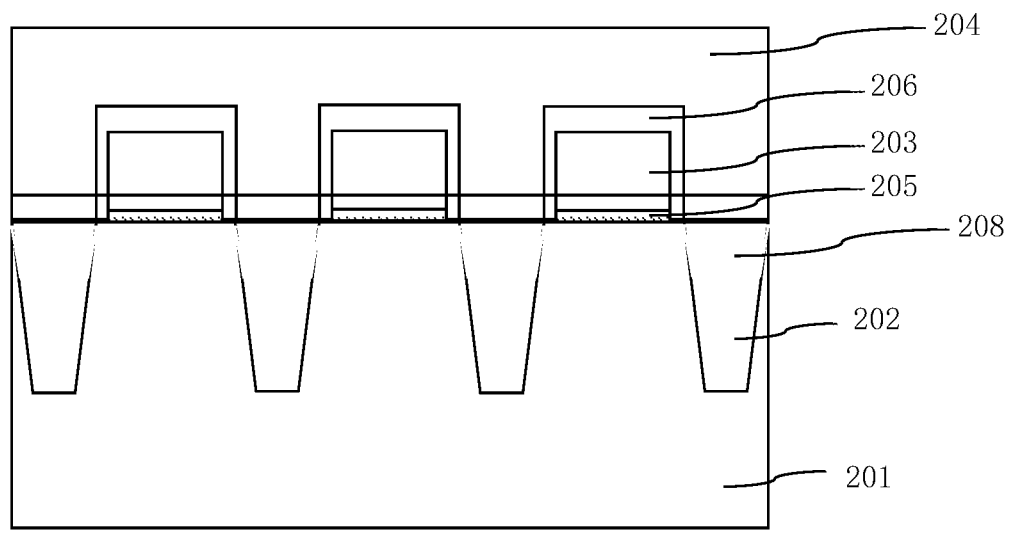
FIG. 9 is a sectional view along the dashed line AA in FIG. 3 obtained after the method for making an active area air gap according to an embodiment of the present application is completed.

FIG. 2 is a flowchart of a method for making an active area air gap 208 according to the embodiment of the present application. FIG. 3 is a top view of a storage area of a NAND flash formed by the method for making an active area air gap 208 according to the embodiment of the present application. FIGS. 4A-8A are sectional views along the dashed line BB in FIG. 3 in steps of the method for making an active area air gap 208 according to the embodiment of the present application. FIGS. 4B-8B are sectional views along the dashed line CC in FIG. 3 in steps of the method for making an active area air gap 208 according to the embodiment of the present application. FIG. 9 is a sectional view along the dashed line AA in FIG. 3 obtained after the method for making an active area air gap 208 according to the embodiment of the present application is completed. The method for making an active area air gap 208 according to the embodiment of the present application includes the following steps:

Step 1. Word line etching is performed to form a plurality of word line structures on a semiconductor substrate 201, wherein a plurality of field oxides 202 are formed on the semiconductor substrate 201, a plurality of active areas are isolated from each other by the field oxides 202, and each of the word line structures spans each of the field oxides 202 and each of the active areas.

In FIG. 3, the semiconductor substrate 201 between the field oxides 202 forms the active area. A section at the dashed line BB is a section along the active area, and a section at the dashed line CC is a section along the field oxide 202. A section at the dashed line AA is a section along the word line structure.

In some embodiments, the semiconductor substrate 201 is a silicon substrate, and the field oxide 202 is shallow trench isolation (STI).

In some embodiments, an area of the word line structure that covers the top of the active area forms a gate structure of a device cell, and the gate structures of all the device cells on the same word line structure are connected together to form a row structure.

All the device cells on the same active area form a column structure, and the row structure and the column structure form an array structure.

In a formation area of the array structure, the length directions of all the active areas are parallel to each other.

The length direction of each of the word line structures is perpendicular to the length direction of the active area.

In some example embodiments, the device cell includes a memory cell of a NAND flash, and the array structure forms a storage array of the NAND flash.

Figure 4A:
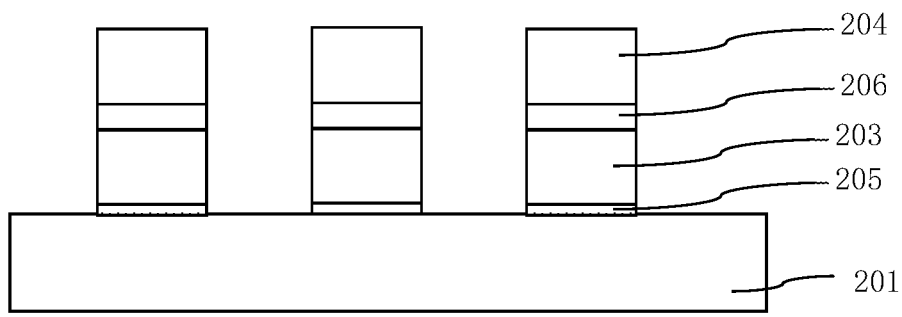

Referring to FIG. 4A, the gate structure of the memory cell includes a tunneling dielectric layer 205, a floating gate 203, an inter-gate dielectric layer 206, and a control gate 204 that are stacked in sequence. In FIG. 3, a top view structure of the word line structure is the same as a top view structure of the control gate 204.

A structure of the word line structure that covers the top of the field oxide 202 includes the inter-gate dielectric layer 206 and the control gate 204 stacked in sequence.

The tunneling dielectric layer 205 and the floating gate 203 are located in an overlap area of the control gate 204 and the active area. In FIG. 3, a formation area of the floating gate 203 is represented by a dashed line box.

The floating gate 203 and the control gate 204 are both formed of polysilicon, and the inter-gate dielectric layer 206 is also referred to as an interpoly dielectric layer (IPD).

The material of the tunneling dielectric layer 205 is an oxide layer.

The inter-gate dielectric layer 206 is composed of an oxide layer or a stack layer of an oxide layer, a nitride layer, and an oxide layer, i.e., an ONO layer.

Figure 4B:
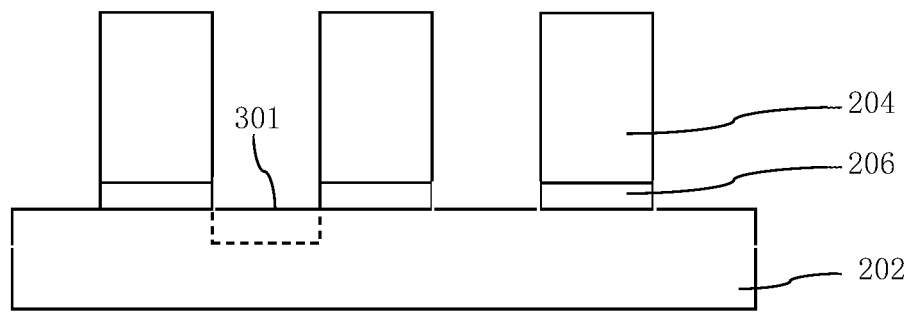

In some embodiments, before the subsequent formation of a protective spacer 207, the method further includes performing first etching on the field oxide 202 outside the coverage area of the word line structure, wherein the first etching is anisotropic etching, the first etching makes the top surface of the field oxide 202 outside the coverage area of the word line structure lower than the top surface of the active area, the top surface of the field oxide 202 within the coverage area of the word line structure is higher than the top surface of the field oxide 202 outside the coverage area of the word line structure, and therefore the side surface of the field oxide 202 is formed at the bottom of the word line structure. Referring to FIG. 4B, a groove formed by the first etching is shown in the dashed line box 301.

In some embodiments, the first etching is directly implemented by means of the word line etching. In this case, after etching of the tunneling dielectric layer 205 is completed, the etching continues downwards to etch the field oxide 202.

An etching amount of the first etching on the field oxide 202 is 200-500 Å.

Step 2. A protective spacer 207 is formed on a side surface of the word line structure in a self-aligned manner, wherein the materials of the protective spacer 207 and the field oxide 202 have different etching rates.

In some example embodiments, the material of the protective spacer 207 is a polymer 207a. The material of the polymer 207a is primarily $C_2F_4$ or $C_4F_6$.

Sub-steps of forming the protective spacer 207 include the following.

Figure 5A:
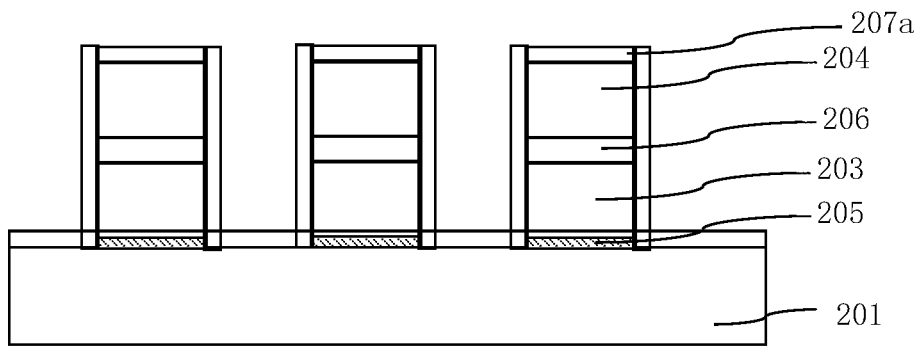
Figure 5B:
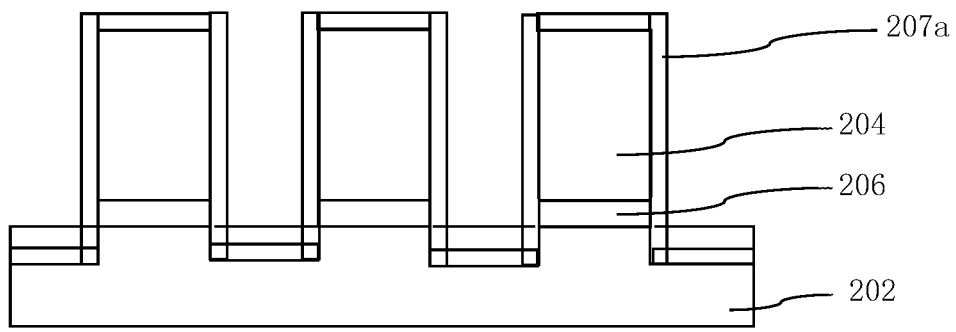

Referring to FIG. 5A, after gate etching is completed, the polymer 207a is directly deposited in an etching machine for the gate etching. Referring to FIG. 5B, within an area of the field oxide 202, the polymer 207a extends to the side surface of the field oxide 202 at the bottom of the word line structure. In an example, a deposition thickness of the polymer 207a is 10-30 Å.

Figure 6A:
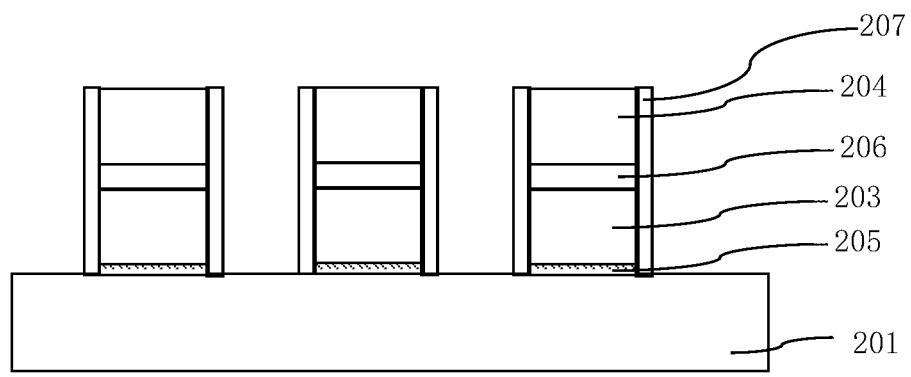
Figure 6B:
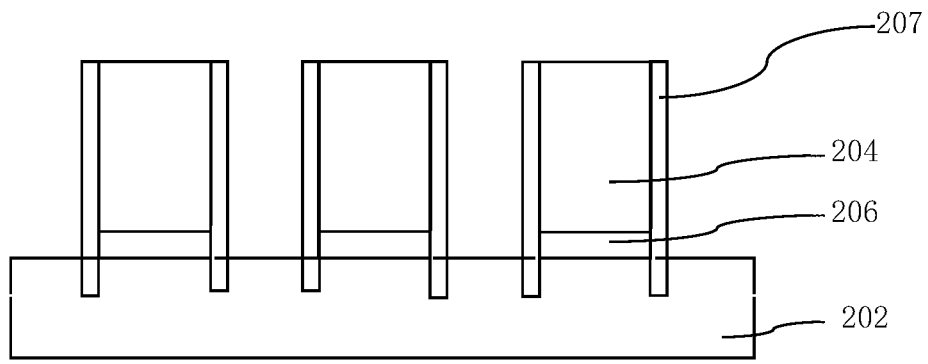

Referring to FIG. 6A, after deposition of the polymer 207a is completed, self-aligned etching is directly performed in the etching machine for the gate etching to form the protective spacer 207. The self-aligned etching removes the polymer 207a on both the top surface of the control gate 204 and the surface outside the word line structure. The polymer 207a retained on the side surface of the word line structure forms the protective spacer 207. Referring to FIG. 6B, within the area of the field oxide 202, the protective spacer 207 extends to the side surface of the field oxide 202 at the bottom of the word line structure.

Step 3. Referring to FIG. 7B, the field oxide 202 is etched by means of isotropic etching, so as to lower the top surfaces of the field oxides 202 within and outside a coverage area of the word line structure and thus form an active area air gap 208 between the active areas, wherein the word line structure spans the active area air gap 208, during the isotropic etching, an etching rate of the protective spacer 207 is less than an etching rate of the field oxide 202, and after the isotropic etching is completed, the protective spacer 207 is retained on the side surface of the word line structure to protect the word line structure.

Figure 7A:
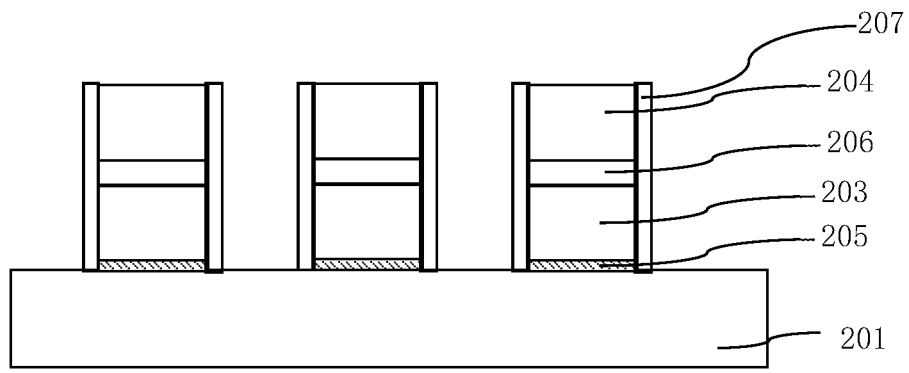
Figure 7B:
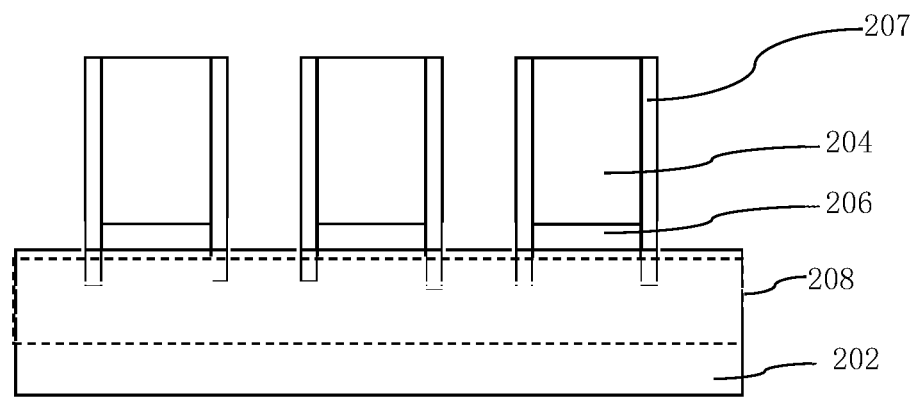

An area corresponding to FIG. 7A is located in the active area, and therefore does not include the field oxide 202. It can be seen from FIG. 7A and FIG. 7B that the word line structure is protected by the protective spacer 207 from a damage. In the embodiment of the present application, the tunneling dielectric layer 204 in the word line structure is an oxide layer, and the inter-gate dielectric layer 206 is also an oxide layer. If the protective spacer 207 does not exist, an etching damage occurs to the tunneling dielectric layer 204 and the inter-gate dielectric layer 206 during the isotropic etching on the field oxide 202 which is also an oxide layer.

In some example embodiments, an etching amount of the isotropic etching on the field oxide 202 is ½ of the width of the word line structure. The width of word line structure corresponds to a channel length of the device cell. Corresponding to the etching on the field oxide 202 at the bottom of the word line structure, during the isotropic etching, the etching starts from the side surface of the word line structure to the middle position of the word line structure. When spaces formed by etching on two side surfaces of the word line structure communicate with each other, the etching amount on the field oxide 202 is exactly ½ of the width of the word line structure. The active area air gap 208 formed at this time is sufficient to reduce interference between channel areas of two adjacent device cells in the lateral direction. In other embodiments, the etching amount of the isotropic etching on the field oxide 202 may be less than or greater than ½ of the width of the word line structure.

Step 4. Referring to FIG. 8A, the protective spacer 207 is removed. FIG. 8B shows the active area air gap 208 where the protective spacer 207 is removed.

Referring to FIG. 9, along the direction of dashed line AA in FIG. 3, the gate structure spans the active area and the field oxide 202. After the active area air gap 208 is formed, it can be seen from FIG. 9 that the active area air gap 208 is located between the retained field oxide 202 and the gate structure, and the bottom surface of the inter-gate dielectric layer 206 of the gate structure may also include the retained field oxide 202 of a part of the thickness thereof.

In some embodiments, the protective spacer 207 is removed by means of wet etching.

In the embodiment of present application, the steps of self-aligned formation of the protective spacer 207 on the side surface of the word line structure and isotropic etching on the field oxide 202 are added after word line etching. In this way, not only the field oxide 202 outside the coverage area of the word line structure can be removed, the field oxide 202 under the coverage area of the word line structure can also be removed to form the active area air gap 208, thereby effectively reducing coupling capacitance between the active areas and reducing crosstalk. When the present application is applied to a NANS flash, programming and erasing windows and reliability can be improved.

An etching area of the field oxide 202 in the embodiment of the present application is a protective spacer 207 formed in a self-aligned manner, having the characteristics of simple and easily achievable processes.

The protective spacer 207 in the present application can also protect the word line structure during the isotropic etching on the field oxide 202, so that no damage occurs to the composition structure of the word line structure.

The present application is described in detail above by using specific embodiments, which, however, are not intended to limit the present application. Without departing from the principles of the present application, those skilled in the art can also make many modifications and improvements, which should also be regarded as the scope of protection of the present application.

What is claimed is:

1. A method for making an active area air gap, comprising the following steps:
   step 1, performing word line etching to form a plurality of word line structures on a semiconductor substrate, wherein a plurality of field oxides are formed on the semiconductor substrate, a plurality of active areas are isolated from each other by the field oxides, and each of the word line structures spans each of the field oxides and each of the active areas;
   step 2, forming a protective spacer on a side surface of the word line structure in a self-aligned manner, wherein the materials of the protective spacer and the field oxide have different etching rates;
   step 3, etching the field oxide by means of isotropic etching, so as to lower the top surfaces of the field oxides within and outside a coverage area of the word line structure and thus form an active area air gap between the active areas, wherein the word line structure spans the active area air gap, during the isotropic etching, an etching rate of the protective spacer is less than an etching rate of the field oxide, and after the isotropic etching is completed, the protective spacer is retained on the side surface of the word line structure to protect the word line structure; and
   step 4, removing the protective spacer.

2. The method for making an active area air gap according to claim 1, before the formation of the protective spacer in step 2, further comprising performing first etching on the field oxide outside the coverage area of the word line structure, wherein the first etching is anisotropic etching, the first etching makes the top surface of the field oxide outside the coverage area of the word line structure lower than the top surface of the active area, the top surface of the field oxide within the coverage area of the word line structure is higher than the top surface of the field oxide outside the coverage area of the word line structure, and therefore the side surface of the field oxide is formed at the bottom of the word line structure; and
   in step 2, within an area of the field oxide, the protective spacer extends to the side surface of the field oxide at the bottom of the word line structure.

3. The method for making an active area air gap according to claim 2, wherein the first etching is directly implemented by means of the word line etching.

4. The method for making an active area air gap according to claim 1, wherein an area of the word line structure that covers the top of the active area forms a gate structure of a device cell, and the gate structures of all the device cells on the same word line structure are connected together to form a row structure.

5. The method for making an active area air gap according to claim 4, wherein all the device cells on the same active area form a column structure, and the row structure and the column structure form an array structure.

6. The method for making an active area air gap according to claim 5, wherein in a formation area of the array structure, the length directions of all the active areas are parallel to each other.

7. The method for making an active area air gap according to claim 6, wherein the length direction of each of the word line structures is perpendicular to the length direction of the active area.

8. The method for making an active area air gap according to claim 5, wherein the device cell comprises a memory cell of a NAND flash, and the array structure forms a storage array of the NAND flash.

9. The method for making an active area air gap according to claim 8, wherein a gate structure of the memory cell comprises a tunneling dielectric layer, a floating gate, an inter-gate dielectric layer, and a control gate that are stacked in sequence.

10. The method for making an active area air gap according to claim 9, wherein a structure of the word line structure that covers the top of the field oxide comprises the inter-gate dielectric layer and the control gate stacked in sequence; and
   the tunneling dielectric layer and the floating gate are located in an overlap area of the control gate and the active area.

11. The method for making an active area air gap according to claim 3, wherein an etching amount of the first etching on the field oxide is 200-500 Å.

12. The method for making an active area air gap according to claim 11, wherein the material of the protective spacer is a polymer.

13. The method for making an active area air gap according to claim 12, wherein after gate etching is completed, the polymer is directly deposited in an etching machine for the gate etching; and
   after deposition of the polymer is completed, self-aligned etching is directly performed in the etching machine for the gate etching to form the protective spacer.

14. The method for making an active area air gap according to claim 13, wherein a deposition thickness of the polymer is 10-30 Å.

15. The method for making an active area air gap according to claim 1, wherein in step 3, an etching amount of the isotropic etching on the field oxide is ½ of the width of the word line structure.

16. The method for making an active area air gap according to claim 12, wherein in step 4, the protective spacer is removed by means of wet etching.

* * * * *